United States Patent

Fay et al.

Patent Number: 5,237,183
Date of Patent: Aug. 17, 1993

[54] HIGH REVERSE VOLTAGE IGT

[75] Inventors: Gary V. Fay; Bernard W. Boland, both of Scottsdale, Ariz.

[73] Assignee: Motorola, Inc., Schaumburg, Ill.

[21] Appl. No.: 450,507

[22] Filed: Dec. 14, 1989

[51] Int. Cl.$^5$ .................. H01L 29/10; H01L 29/74; H01L 29/747; H01L 29/78

[52] U.S. Cl. .................. 257/139; 257/487; 257/583; 257/655

[58] Field of Search .......... 357/13 W, 13 R, 38, 357/23.4, 20, 53, 234, 139, 487, 655, 583

[56] References Cited

U.S. PATENT DOCUMENTS

| | | | |
|---|---|---|---|
| 4,364,073 | 12/1982 | Becke et al. | 357/38 |
| 4,920,062 | 4/1990 | Tsunoda | 357/23.4 |
| 5,031,009 | 7/1991 | Fujihira | 357/23.4 |
| 5,068,704 | 11/1991 | Nakagawa et al. | 357/38 |

FOREIGN PATENT DOCUMENTS 0014377 2/1977 Japan ................. 357/13
0139963 8/1982 Japan ................. 357/13

OTHER PUBLICATIONS

Device Electronics for IC's, 2nd Edition, Richard S. Muller, Theodore I. Kamins, 1982.
IBM Technical Disclosure Bulletin, vol. 19 #8 Jan. 1977.

Primary Examiner—Rolf Hille
Assistant Examiner—Wael Fahmy
Attorney, Agent, or Firm—Joe E. Barbee; Miriam Jackson

[57] ABSTRACT

The reverse breakdown voltage of a conventional insulated gate transistor is greatly increased by the addition of a lightly doped layer between the substrate and a buffer layer of the insulated gate transistor. The addition of the lightly doped layer does not increase the on resistance of the device, nor the cut-off time of the device. The lightly doped layer can be provided as an epitaxial layer along with the other epitaxial layers of the insulated gate transistor.

7 Claims, 1 Drawing Sheet

HIGH REVERSE VOLTAGE IGT

BACKGROUND OF THE INVENTION

This invention relates, in general, to insulated gate transistors (IGT), and more particularly, to an insulated gate transistor having a high reverse breakdown voltage.

Insulated gate transistors, also known as insulated gate bipolar transistors (IGBT), are well known. The basic IGT suffers from a latch-up condition. The latch-up condition was alleviated by the addition of a highly doped N layer positioned between the anode and the epitaxial layer of the IGT transistor. This highly doped N layer, also called a buffer layer, is shown in U.S. Pat. No. 4,364,073 which issued in 1982 to Becke et al. This U.S. Pat. No. (4,364,073) is hereby incorporated herein by reference. One of the disadvantages of adding the highly doped N layer to the basic IGT transistor is that the reverse breakdown voltage of the device decreased. The highest achievable reverse breakdown voltage was approximately 25 volts. Although these IGTs, having reduced latch-up and reverse blocking voltage, are useful in many applications, there are applications where it would be desirable to have an IGT with a high reverse blocking voltage.

Accordingly, it is an object of the present invention to provide an insulated gate transistor having high reverse breakdown voltage capability.

Another object of the present invention is to provide an insulated gate transistor having high breakdown voltages in both forward and reverse directions, as well as being resistant to latch-up conditions.

Another object of the present invention is to provide an improved insulated gate transistor being capable of withstanding high reverse voltages and yet is easily manufactured.

A further object of the present invention is to provide an insulated gate transistor having a high reverse breakdown voltage and yet maintaining a fast turn-off speed.

SUMMARY OF THE INVENTION

The above and other objects and advantages of the present invention are provided in an insulated gate transistor having an anode and a buffer layer by adding a lightly doped layer between the anode and the buffer layer. The lightly doped layer is of the same conductivity type as the anode.

In a preferred embodiment, the insulated gate transistor will have a substrate of a first conductivity type covered by a layer of the first conductivity type which has a lower dopant concentration than does the substrate. The substrate serves as the anode. A buffer layer of a second conductivity type covers the lightly doped layer. An epitaxial layer is then grown over the buffer layer and is also of the second conductivity type and has a lower dopant concentration than does the buffer layer. A base region, an emitter region, and a channel area is then formed in the upper surface of the epitaxial layer.

In one embodiment of the present invention, the substrate or anode has a dopant concentration in the range of $2 \times 10^{18}$ to $1 \times 10^{19}$ atoms/cm$^3$. The lightly doped layer has a dopant concentration in the range of $1 \times 10^{14}$ to $1 \times 10^{16}$ atoms/cm$^3$. The buffer layer has a dopant concentration in the range of $7 \times 10^{16}$ to $7 \times 10^{17}$ atoms/cm$^3$.

BRIEF DESCRIPTION OF THE DRAWING

The single FIGURE shows an enlarged cross-sectional view of a portion of an insulated gate transistor using the present invention.

DETAILED DESCRIPTION OF THE DRAWING

Figure 1:
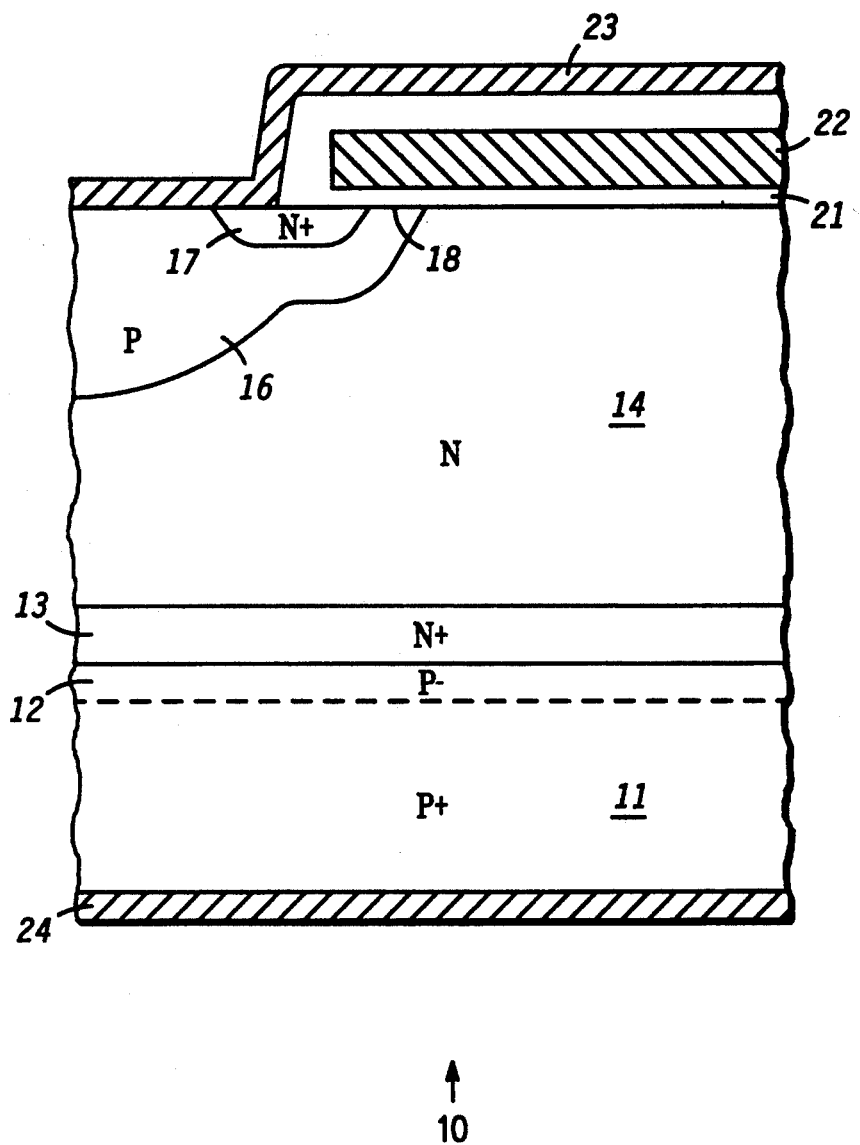

The single FIGURE illustrates an enlarged cross-sectional view of a portion of an insulated gate transistor (IGT) 10. IGT 10 has a P+ substrate 11. A lightly doped P-layer 12 is located over substrate 11. An N+ buffer layer 13 is located over lightly doped P-layer 12. An epitaxial N layer 14 is located over buffer layer 13. In a top surface of epitaxial layer 14, a P-well 16 is formed. P-well 16 is commonly called a base region. An N+ area 17 extends from the surface of epitaxial layer 14 into P-well or base region 16. N+ region 17 is commonly called an emitter region. A channel area 18 is formed between emitter region 17 and the periphery of base region 16. Oxide 21 serves as a gate oxide between epitaxial layer 14 and gate 22. The oxide also serves to insulate gate 22 from emitter electrode 23. Emitter electrode 23 shorts emitter region 17 to base region 16. Collector metallization 24 is located on the bottom of substrate 11. IGBT 10 is enabled when a voltage, which is sufficient to cause an inversion in channel area 18, is applied to gate 22. When the inversion occurs, electrons will flow from emitter region 17, through channel 18 and epitaxial layer 14, down to collector 24.

In a preferred embodiment, P+ substrate 11 has a dopant concentration in the range of $2 \times 10^{18}$ to $1 \times 10^{19}$ atoms/cm$^3$. Lightly doped layer 12 has a dopant concentration in the range of $1 \times 10^{14}$ to $1 \times 10^{16}$ atoms/cm$^3$. Buffer layer 13 has a dopant concentration in the range of $7 \times 10^{16}$ to $7 \times 10^{17}$ atoms/cm$^3$. Epitaxial layer 14 typically has a dopant concentration of approximately $1.5 \times 10^{14}$ atoms/cm$^3$. The dopant ratio between layer 12 and buffer layer 13 must be considered in the practice of the present invention. The dopant concentration of buffer layer 13 must be high in order to lower the injection efficiency of minority carriers. P− layer 12 must have a low dopant concentration in order to provide the high reverse breakdown voltage. Decreasing the dopant concentration of P− layer 12 and making layer 12 thicker will result in a higher reverse breakdown voltage. Typically, the thickness of P− layer 12 is in the range of 5 to 200 microns, depending upon the desired reverse breakdown voltage. The thickness of buffer layer 13 is in the range of 7 to 11 microns. The thickness of epitaxial layer 14 depends upon the desired forward breakdown voltage. As an example, a thickness of 40 microns for epitaxial layer 14 will provide a 500 volt IGBT 10.

In summary, the low dopant concentration of P− layer 12 provides the improved reverse breakdown voltage. The high dopant concentration of buffer layer 13 must inject sufficient minority carriers in order to provide the conductivity modulation to reduce the on resistance ($R_D$ on) of IGBT 10 but not inject enough minority carriers to cause latching. Much to the surprise of many, the addition of lightly doped P-layer 12 did not result in a significant increase in on resistance. It was also thought by some that the addition of P− layer 12 would result in an increased turn-off time of IGT 10. However, once again this did not prove to be the case. The cut-off or fall times are substantially the same for IGT 10 as they are for the conventional devices that do not have P− layer 12. In one particular IGT 10 having a P⁻ layer 12 thickness of 15 microns with a resistivity of 12 ohms-cm, and buffer layer 13 having a thickness of 10 microns with a resistivity of 0.12 ohms-cm, and epitaxial layer 14 having a thickness of 58 microns with a resistivity of 72 ohms-cm, a reverse breakdown voltage, at 5 to 7 amps, of 255 volts was achieved. This is a substantial increase in reverse breakdown voltage over conventional IGBTs not having P⁻ layer 12.

Another advantage of the present invention is that layers 12, 13, and 14 can all be grown in one epitaxial run. Therefore, additional P⁻ layer 12 does not increase the starting material costs of IGT 10. Applications where high reverse blocking voltages are advantageous and necessary include automotive ignition systems, which need a reverse breakdown voltage greater than 75 volts. With reverse breakdown voltages greater than 500 volts, non-latching IGTs could be used in lieu of latching SCRs. These IGTs could also be used directly on 120 and 240 volts AC lines in motor speed control and power supplies.

By now it should be appreciated that there has been provided an improved IGT transistor having an increased reverse breakdown voltage without a substantial increase in cut-off speed of the IGT. The improvement is a result of adding a lightly doped layer between the substrate or anode and the buffer layer of an IGT. The lightly doped layer can be provided epitaxially during the same run that the buffer layer and the epitaxial drain region are provided.

We claim:

1. An insulated gate transistor having a substrate of a first conductivity type and an epitaxial layer of a second conductivity type over the substrate, comprising: a buffer layer of the second conductivity type located between the substrate and the epitaxial layer; and a lightly doped layer of the first conductivity type located between the substrate and the buffer layer wherein the lightly doped layer has a dopant concentration in the range of $1\times10^{14}$ to $1\times10^{16}$ atoms/cm³ and which is lower than the dopant concentration of the substrate and wherein the lightly doped layer increases the reverse breakdown voltage of the insulated gate transistor, wherein the buffer layer is 7 to 11 microns thick and the lightly doped layer is 5 to 200 microns thick.

2. The insulated gate transistor of claim 1 wherein the substrate has a dopant concentration in the range of $2\times10^{18}$ to $1\times10^{19}$ atoms/cm³.

3. The insulated gate transistor of claim 1 wherein the buffer layer has a dopant concentration in the range of $7\times10^{16}$ to $7\times10^{17}$ atoms/cm³.

4. An insulated gate transistor having a high reverse breakdown voltage, comprising: a substrate of a first conductivity type; a first epitaxial layer on the substrate of the first conductivity type and having a dopant concentration in the range of $1\times10^{14}$ to $1\times10^{16}$ atoms/cm³ and which is lower than the dopant concentration of the substrate to increase the reverse breakdown voltage of the insulated gate transistor, wherein the first epitaxial layer has a thickness ranging from 5 to 200 microns; a second epitaxial layer of a second conductivity type on the first epitaxial layer to serve as a buffer layer; a third epitaxial layer of the second conductivity type on the second epitaxial layer; a base region of the first conductivity type extending into the third epitaxial layer; an emitter region of the second conductivity type extending into the base region and spaced from a periphery of the base region in order to form a channel between the emitter region and the periphery; an insulated gate positioned over the channel; an emitter electrode forming an electrical connection between the emitter region and the base region; and a collector electrode providing electrical contact to the substrate.

5. The insulated gate transistor of claim 4 wherein the substrate has a dopant concentration in the range of $2\times10^{18}$ to $1\times10^{19}$ atoms/cm³.

6. An insulated gate transistor having an improved reverse breakdown voltage made from the following method, comprising the steps of: providing a semiconductor substrate of a first conductivity type; providing a layer of the first conductivity type over the substrate and having a thickness ranging from 5 to 200 microns and a dopant concentration in the range of $1\times10^{14}$ to $1\times10^{16}$ atoms/cm³ and which is lower than the dopant concentration of the substrate and which increases the reverse breakdown voltage of the insulated gate transistor; providing a buffer layer of a second conductivity type over the layer of a first conductivity type; providing an epitaxial layer of the second conductivity type over the buffer layer; providing a first region of the first conductivity type extending into the epitaxial layer; and providing a second region of the second conductivity type extending into the first region.

7. An insulated gate transistor having a substrate of a first conductivity type and an epitaxial layer of a second conductivity type over the substrate, comprising: a buffer layer of the second conductivity type located between the substrate and the epitaxial layer; and a lightly doped layer of the first conductivity type located between the substrate and the buffer layer wherein the lightly doped layer has a dopant concentration lower than the dopant concentration of the substrate and wherein the lightly doped layer increases the reverse breakdown voltage of the insulated gate transistor by having a dopant concentration in the range of $1\times10^{14}$ to $1\times10^{16}$ atoms/cm³ and a thickness of 5 to 200 microns.

* * * * *